United States Patent [19]
Ngo et al.

[11] Patent Number: 5,888,911
[45] Date of Patent: Mar. 30, 1999

[54] HSQ PROCESSING FOR REDUCED DIELECTRIC CONSTANT

[75] Inventors: Minh V. Ngo, Union City; Khanh Q. Tran, San Jose; Lu You, Santa Clara; Jean Y. Yang, Palo Alto; Richard J. Huang, Cupertino, all of Calif.

[73] Assignee: Advanced Micro Devices, Inc., Sunnyvale, Calif.

[21] Appl. No.: 956,590

[22] Filed: Oct. 23, 1997

[51] Int. Cl.$^6$ .................................................. H01L 21/316
[52] U.S. Cl. .......................... 438/788; 438/788; 438/622; 438/624; 438/637; 438/761; 438/763; 438/692
[58] Field of Search ..................... 438/761, 763, 438/622, 624, 637, 692, 723, 782, 787, 788, 789

[56] References Cited

U.S. PATENT DOCUMENTS

| | | | |
|---|---|---|---|
| 5,506,177 | 4/1996 | Kishimoto et al. ..................... | 438/624 |
| 5,548,159 | 8/1996 | Jeng ........................................ | 257/634 |
| 5,656,555 | 8/1997 | Cho ......................................... | 438/780 |
| 5,728,630 | 3/1998 | Nishimura et al. ..................... | 438/790 |

OTHER PUBLICATIONS

Konecni et al., "A Stable Plasma Treated CVD Titanium Nitride Film for Barrier/Glue Layer Applications," Jun. 18–20, 1996, VMIC Conference, 1996 ISMIC –106/96/0181(c), pp. 181–183.

Kim et al., "Stability of TiN Films Prepared by Chemical Vapor Deposition Using Tetrakis–dimethylamino Titanium," J. Electrochem. Soc., vol. 143, No. 9, Sep. 1996, The Electrochemical Society, Inc., pp. L188–L190.

Iacoponi et al., "Resistivity Enhancement of CVD TiN with In–Situ Nitrogen Plasma and Its Application In Low Resistance Multilevel Interconnects," Advanced Metalization and Interconnection System for ULSI Applications, 1995 (5 pages).

Eizenberg et al., "Chemical vapor deposition TiCN: A new barrier metallization for submicron via and contact applications," J. Vac. Sc. Technol. A 13(3), May/Jun., 1995, 1995 American Vacuum Society, pp. 590–595.

Eizenberg et al., "TiCN: A new chemical vapor deposited contact barrier metallization for submicron devices," (3 pages).

Hillman et al., "Comparison of Titanium Nitride Barrier Layers Produced by Inorganic and Organic CVD," Jun. 9–10, 1992, VMIC Conference, 1992 ISMIC–101/92/0246, pp. 246–252.

Liu et al., "Integrated HDP Technology for Sub–0.25 Micron Gap Fill," Jun. 10–12, 1997, VMIC Conference, 1997 ISMIC –107/97/0618(c), pp. 618–619.

Bothra et al., "Integration of 0.25$\mu$m Three and Five Level Interconnect System for High Performance ASIC," Jun. 10–12, 1997, VMIC Conference, 1997 ISMIC –107/97/0043(c), pp. 43–48.

Wang et al., "Process Window Characterization of ULTIMA HDP–CVD® USG Film," Feb. 10–11, 1997, DUMIC Conference, 1997 ISMIC –222D/97/0405, pp. 405–408, 619.

Saikawa et al., "High Density Plasma CVD for 0.3$\mu$m Device Application," Jun. 18–20, 1996, VMIC Conference, 1996 ISMIC –106/96/0069(c), pp. 69–75.

Nguyen et al., "Characterization of High Density Plasma Deposited Silicon Oxide Dielectric for 0.25 Micron ULSI," Jun. 27–29, 1995, VMIC Conference, 1995 ISMIC –104/95/0069, pp. 69–74.

*Primary Examiner*—Charles Bowers
*Assistant Examiner*—Thanh Nguyen

[57] ABSTRACT

Patterned metal layers are gap filled with HSQ and heat soaked in an oxidizing environment prior to oxide deposition by PECVD and planarization. Heat soaking is confined to less than about 10 seconds to minimize the dielectric constant of the HSQ layer.

12 Claims, 1 Drawing Sheet

HSQ PROCESSING FOR REDUCED DIELECTRIC CONSTANT

TECHNICAL FIELD

The present invention relates to a method of manufacturing a multi-metal layer semiconductor device with reliable interconnection patterns having a low RC time constant. The invention has particular applicability in manufacturing high density multi-metal layer semiconductor devices with design features of 0.25 microns and under.

BACKGROUND ART

The escalating requirements for high densification and performance associated with ultra large scale integration semiconductor devices require design features of 0.25 microns and under, such as 0.18 microns, increased transistor and circuit speeds, high reliability and increased manufacturing throughput. The reduction of design features to 0.25 microns and under generates numerous problems challenging the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric interlayer on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric material, such as spin on glass (SOG), is typically deposited to fill in the gaps between the metal features, and baked at a temperature of about 300° C. to about 450° C., for a period of time up to about two hours, depending upon the particular SOG material employed. Planarization, as by CMP, is then performed.

The drive to increased density and attendant shrinkage in feature size generates numerous problems. For example, as feature sizes, e.g., metal lines and interwiring spacings, shrink to 0.25 microns and below, such as 0.18 microns, it becomes increasingly difficult to satisfactorily fill in the interwiring spacings voidlessly with a dielectric material and obtain adequate step coverage. It also becomes increasingly difficult to form a reliable interconnection structure. A through-hole is typically formed in a dielectric layer to expose an underlying metal feature, wherein the metal feature serves as a landing pad occupying the entire bottom of the through-hole. Upon filling the through-hole with conductive material, such as a metal plug to form a conductive via, the entire bottom surface of the conductive via is in direct contact with the metal feature.

Another problem generated by miniaturization relates to the RC time constant. Although semiconductor devices are being scaled in the horizontal dimension, they are not generally scaled in the vertical dimension, since scaling in both dimensions would lead to a higher current density that could exceed reliability limits. Horizontal scaling, therefore, requires conductive lines having a high aspect ratio, i.e., conductor height to conductor width of greater than one, with reduced interwiring spacings. As a result, capacitive coupling between conductive lines becomes a primary limitation on circuit speed. If intrametal capacitance is high, the possibility for electrical inefficiencies and inaccuracies increase. It is recognized that a reduction in capacitance within multi-level metallization systems will reduce the RC time constant between the conductive lines.

Hydrogen silsesquioxane (HSQ) offers many advantages for use in interconnect technology. HSQ is relatively carbon free, thereby rendering it unnecessary to etch back HSQ below the upper surface of the metal lines to avoid poison via problems. In addition, HSQ exhibits excellent planarity and is capable of gap filling interwiring spacings less than 0.15 microns employing conventional spin-on equipment. HSQ undergoes a melting phase at approximately 200° C.; it does not convert to the high dielectric constant glass phase until reaching temperatures of about 400° C. in intermetal applications. As deposited HSQ is considered a relatively low dielectric constant material with a dielectric constant of about 2.9–3.0, vis-a-vis silicon dioxide grown by a thermal oxidation or chemical vapor deposition which has a dielectric constant of about 3.9–4.2. The mentioned dielectric constants are based on a scale wherein 1.0 represents the dielectric constant of air.

However, in attempting to apply HSQ to interconnect technology, particularly for gap filling, it was found that its dielectric constant became undesirably high as a result of subsequent processing. For example, a layer of HSQ was initially deposited on a patterned metal layer to fill in gaps between metal features. Subsequently, an oxide layer was deposited and planarized. Such an oxide layer included silicon dioxide derived from tetraethyl orthosilicate (TEOS) deposited by plasma enhanced chemical vapor deposition (PECVD) in an oxygen-containing atmosphere at about 400° C. During the PECVD TEOS process and prior to the actual deposition of TEOS, the wafer would sit in contact with a heater block under a TEOS/$O_2$ ambient to acclimate the wafer to deposition conditions. This stabilization period is typically at the deposition temperature for about 20 seconds or longer. Another such oxide layer is silicon dioxide derived from silane deposited by PECVD in an $N_2O$-containing atmosphere, at about 400° C. with a similar stabilization period as in the use of TEOS. It was found that after such depositions of silicon dioxide by PECVD, the dielectric constant of the deposited HSQ layer undesirably increased from about 2.9–3.0 to about 3.6–3.7. This rise in dielectric constant is believed to be a result of the oxidation of the top surface of the HSQ due to exposure to an oxygen-containing ambient at an elevated temperature. The undesirable increase in the dielectric constant of the HSQ layer adversely impacts the intrametal capacitance and, therefore, circuit speed.

Accordingly, there exists a need for methodology enabling the use of HSQ as a dielectric material in interconnect technology, particularly for gap filling a patterned metal layer with subsequent deposition of an oxide and planarization, without adversely increasing the dielectric constant of the HSQ layer.

DISCLOSURE OF THE INVENTION

An object of the present invention is a method of manufacturing a high density, multi-metal layer semiconductor device with design features of 0.25 microns and under, and an interconnection pattern comprising HSQ exhibiting a relatively low dielectric constant.

Additional objects, advantages and other features of the present invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a multilevel semiconductor device, which method comprises: forming a first dielectric interlayer on a substrate; forming a first patterned metal layer, having gaps therein and comprising a first metal feature, on the first dielectric interlayer; depositing a layer of hydrogen silsesquioxane (HSQ) filling the gaps; heat soaking at a temperature of about 400° C. in an oxidizing atmosphere for up to about 10 seconds; and depositing an oxide layer on an upper surface of the heat soaked HSQ layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
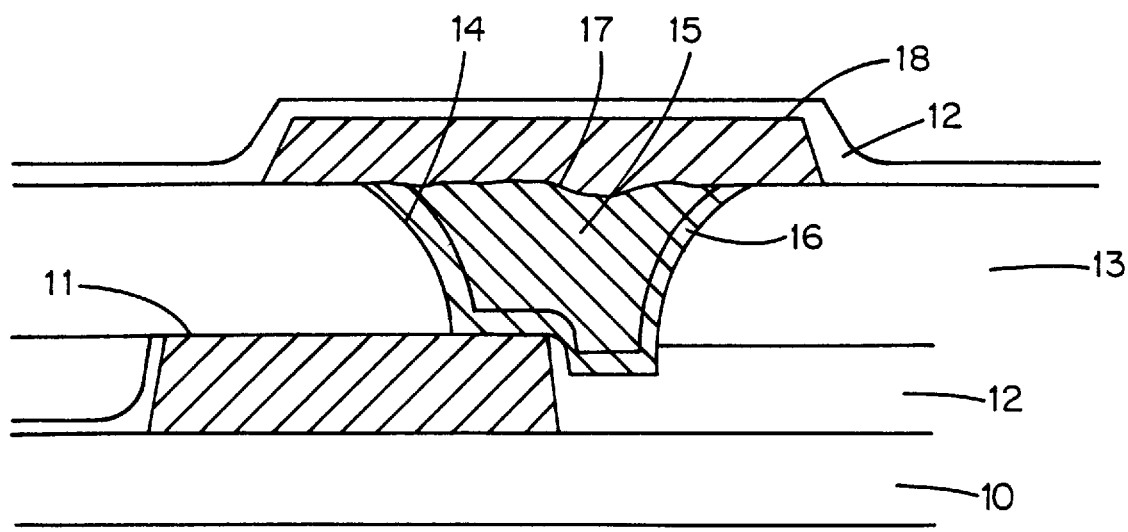
FIG. 1 schematically illustrates an embodiment of the present invention.

The present invention enables the use of HSQ for gap filling patterned metal layers in forming highly reliable interconnections, while avoiding an undesirable increase in the dielectric constant of the HSQ layer due to subsequent processing, including PECVD of silicon dioxide and planarization. The mechanism responsible for an increase in the dielectric constant of the deposited HSQ as a result of such subsequent processing is not clearly known. However, it is believed that at least some increase in the dielectric constant is caused by oxidation of the HSQ during the stabilization (heat soak) period prior to PECVD deposition. This leads to a degradation in dielectric constant.

In accordance with the present invention, HSQ is deposited to gap fill a patterned metal layer, as by employing conventional spin on equipment. Subsequently, an oxide is deposited, such as silicon dioxide, by PECVD in an oxidizing environment at a temperature of about 400° C. For example, after deposition of the HSQ gap filling layer, silicon dioxide derived from TEOS is deposited by PECVD in an oxygen-containing atmosphere followed by planarization, e.g., chemical-mechanical-polishing. In another embodiment, silicon dioxide derived from silane is deposited by PECVD in an atmosphere containing $N_2O$ at about 400° C. and planarized. As part of the PECVD of the oxide process, the wafer containing the deposited HSQ is heat soaked, i.e., brought to a temperature proximate the PECVD temperature in an oxidizing environment. When depositing silicon dioxide derived from TEOS, heat soaking is conducted in an oxygen-containing environment; whereas, if the deposited oxide is derived from silane, heat soaking is conducted in an atmosphere containing $N_2O$. However, in accordance with the present invention, the heat soaking period of time is restricted to no longer than about 10 seconds, for example about 2 seconds to about 10 seconds, in order to avoid an undesirable increase in the dielectric constant of the deposited HSQ layer.

Experimentation demonstrated that part of the increase in the dielectric constant of an HSQ layer as a result of subsequent oxide deposition and planarization can be alleviated by restricting the time of heat soaking to acclimate the HSQ layer prior to PECVD oxide deposition. The mechanism responsible for alleviating an increase in the dielectric constant of the HSQ layer by restricting the duration of heat soaking is not clearly known. However, it is believed that HSQ undergoes degradation in an oxidizing atmosphere at elevated temperatures, with an attendant conversion to a high dielectric constant form. Experimentation confirmed that a reduced heat soaking (stabilization) period of about 10 seconds and below alleviates the increase in the dielectric constant of HSQ.

Thus, the present invention enables the use of HSQ for gap filling patterned metal layers while alleviating an undesirable increase in its dielectric constant upon subsequent oxide deposition and planarization. The present invention can be employed in various phases of semiconductor manufacturing wherein HSQ is employed, particularly in gap filling patterned metal layers.

An embodiment of the present invention in the context of a borderless via is schematically illustrated in FIG. 1, wherein a patterned metal layer comprising metal feature 11 is formed on dielectric interlayer 10. Embodiments of the present invention include forming a composite patterned metal layer comprising an initial titanium layer, an intermediate layer comprising aluminum or an aluminum alloy, and an upper anti-reflective coating, such as titanium-titanium nitride. Gaps between metal features of the patterned metal layer are filled with HSQ 12. An oxide layer 13 is then deposited on HSQ layer 12.

Prior to deposition of oxide layer 13, the wafer is heat soaked at a temperature and in an atmosphere compatible with the deposition conditions employed for depositing oxide layer 13. In one embodiment, the oxide layer 13 comprises silicon dioxide derived from TEOS by PECVD in an oxygen-containing atmosphere at a temperature of about 400° C., in which case the wafer is heat soaked at 400° C. in an oxygen-containing environment for no more than about 10 seconds, preferably between about 2 seconds and about 10 seconds. In another embodiment, the oxide layer 13 is derived from silane by PECVD in an $N_2O$-containing environment at a temperature of about 400° C., in which case the wafer is heat soaked at about 400° C. in an $N_2O$-containing atmosphere for no greater than about 10 seconds, preferably between about 2 seconds and about 10 seconds. By restricting the duration of heat soaking to no longer than about 10 seconds, an undesirable increase in the dielectric constant of the HSQ layer is avoided. Subsequent to deposition of oxide layer 13, surface planarization is performed, as by chemical-mechanical-polishing.

A borderless through-hole 14 is etched to make contact with metal feature 11, part of it which may "fall off" metal feature 11 as shown in FIG. 1. The bottom of through-hole 14 exposes a portion of the upper surface of metal feature 11 and penetrates and exposes the HSQ layer 12. Advantageously, the methodology disclosed in copending application Ser. No. 08/992,430, filed Dec. 18, 1997 can be employed to improve the etching resistance of HSQ proximate the side surfaces of metal feature 11 by selective heating, thereby preventing through-hole 14 from penetrating to or through first dielectric interlayer 10.

Through-hole 14 is then filled with a conductive plug comprising an adhesion layer 16 which serves as an adhesion promoter for subsequently deposited tungsten 15. Adhesion promoting layer 16 can comprise a refractory metal typically employed for improving the adhesion of tungsten to an underlying metal feature. Such a refractory material car be titanium, titanium nitride, titanium-tungsten or titanium-titanium nitride. Titanium-titanium nitride can be sputter deposited, while titanium nitride can be deposited by CVD as disclosed in copending application Ser. No. 08/924,131, filed Sep. 5, 1997.

After formation of conductive via 17, a second patterned metal layer is formed on dielectric interlayer 13 and comprises metal feature 18 electrically connected to metal feature 11 through conductive via 17. The process is then repeated by gap filling the second patterned metal layer employing HSQ and heat soaking in accordance with the present invention for no longer than about 10 seconds, depositing another oxide layer, and planarizing until the desired number of patterned metal layers are formed and gap filled, e.g., five metal layers.

EXAMPLE

Four dielectric interlayers of silicon dioxide were deposited on four substrates. A patterned metal layer comprising aluminum and a titanium-titanium nitride anti-reflective coating were deposited on each dielectric interlayer and similarly patterned to form a plurality of metal lines having a width of about 0.50 microns and an interwiring spacing of about 0.35 to about 0.45 microns. A layer of HSQ was applied by spin coating at a temperature of about 200° C.

Sample A was heat soaked at a temperature of about 400° C. for 20 seconds in an oxygen-containing atmosphere, and a layer of silicon dioxide was deposited thereon by PECVD from TEOS in an $O_2$-containing atmosphere at a temperature of about 400° C. The dielectric constant of the HSQ was determined to be 3.3.

Sample B was processed in a manner identical to Sample A, except that the heat soaking period was reduced to 10 seconds with an attendant reduction in the dielectric constant of the HSQ layer of 3.1.

Sample C was heat soaked at about 400° C. in an $N_2O$-containing atmosphere for about 20 seconds, and a layer of silicon dioxide was deposited thereon by PECVD employing silane in an $N_2O$-containing atmosphere at a temperature of about 400° C. The dielectric constant of the HSQ layer was determined to be 3.75.

Sample D was processed in a manner identical to Sample C, except that the heat soaking period was reduced to 10 seconds, with an attendant reduction in the dielectric constant of HSQ to 3.34.

The experimental results indicate that the dielectric constant of HSQ varies depending upon the particular conditions involved in subsequent processing, e.g., whether the silicon dioxide layer is derived from TEOS and $O_2$ or from silane and $N_2O$. The exact nature of the interaction or mechanisms involved are not known. However, regardless of the interaction or involved mechanisms, the experimental results indicate that a reduction in the heat soaking time prior to silicon dioxide deposition alleviates an undesirable increase in the dielectric constant of the HSQ layer.

The present invention is applicable to the production of various types of semiconductor device, particularly high density, multi-metal patterned layers with submicron features, particularly submicron features of about 0.25 microns and below, exhibiting high speed characteristics and improved reliability. The present invention enables the advantageous use of HSQ to gap fill patterned metal layers without an undesirable increase in its dielectric constant by limiting the period of heat soaking to less than about 10 seconds prior to PECVD of an oxide layer thereon. The present invention is cost effective and can easily be integrated into conventional processing equipment.

In carrying out the embodiments of the present invention, the metal layers can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and PECVD. Normally, when high melting metal point metals such as tungsten are deposited, CVD techniques are employed. Low melting point metals, such as aluminum and aluminum-base alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a multilevel semiconductor device, which method comprises:
   forming a first dielectric interlayer on a substrate;
   forming a first patterned metal layer, having gaps therein and comprising a first metal feature, on the first dielectric interlayer;
   depositing a layer of hydrogen silsesquioxane (HSQ) filing the gaps;
   heat soaking at a temperature up to about 400° C. in an oxidizing atmosphere for up to about 10 seconds; and
   depositing an oxide layer on an upper surface of the heat soaked HSQ layer.

2. The method according to claim 1, further comprising planarizing after depositing the oxide layer.

3. The method according to claim 1, wherein the oxide layer comprises a silicon oxide and is deposited under plasma conditions.

4. The method according to claim 3, comprising depositing the silicon oxide in an oxidizing atmosphere at a temperature up to about 400° C.

5. The method according to claim 4, comprising depositing silicon dioxide derived from tetraethyl orthosilicate (TEOS) in the presence of oxygen by plasma enhanced chemical vapor deposition.

6. The method according to claim 5, wherein the HSQ layer, after deposition of the silicon dioxide layer, has a dielectric constant no greater than about 3.1.

7. The method according to claim 5, comprising depositing silicon dioxide derived from silane in an $N_2O$ atmosphere by plasma enhanced chemical vapor deposition.

8. The method according to claim 7, wherein the HSQ layer, after deposition of the silicon dioxide layer, has a dielectric constant no greater than about 3.34.

9. The method according to claim 5, comprising heat soaking in an atmosphere containing oxygen.

10. The method according to claim 7, comprising heat soaking in an atmosphere containing $N_2O$.

11. The method according to claim 1, further comprising:
depositing a second dielectric interlayer on the first patterned metal layer;
forming a through-hole in the second dielectric layer exposing a portion of the first metal feature, the HSQ layer and the oxide layer;
filling the through-hole with a conductive material to form a via; and
forming a second patterned layer, having a second metal feature on the second dielectric interlayer and electrically connected to the first metal feature through the via.

12. The method according to claim 1, comprising heat soaking for about 2 seconds to about 10 seconds.

* * * * *

UNITED STATES PATENT AND TRADEMARK OFFICE
CERTIFICATE OF CORRECTION

PATENT NO. : 5,888,911
DATED : March 30, 1999
INVENTOR(S) : Minh V. NGO et al

It is certified that error appears in the above-identified patent and that said Letters Patent is hereby corrected as shown below:

Claim 1, Line 53, change "filing" to --filling--

Signed and Sealed this

Tenth Day of August, 1999

Attest:

Q. TODD DICKINSON

*Attesting Officer*     *Acting Commissioner of Patents and Trademarks*